United States Patent [19]

Haynes

[11] Patent Number: 5,580,641
[45] Date of Patent: Dec. 3, 1996

[54] METHOD OF FORMING ELECTRICAL PATHWAYS IN INDIUM-TIN-OXIDE COATINGS

[75] Inventor: Tony E. Haynes, Knoxville, Tenn.

[73] Assignee: Lockheed Martin Energy Systems, Inc., Oak Ridge, Tenn.

[21] Appl. No.: 450,180

[22] Filed: May 25, 1995

[51] Int. Cl.$^6$ .................................................. B32B 17/06
[52] U.S. Cl. ........................ 428/195; 428/697; 428/701; 428/702
[58] Field of Search .................................. 428/195, 697, 428/701, 702

[56] References Cited

U.S. PATENT DOCUMENTS 4,255,474   3/1981   Smith, Jr. .................................. 428/702

OTHER PUBLICATIONS

Cox et al "Surface Reconstructions of oxygen deficient SnO$_2$(110)" Surface Science 224 (1989) pp. 121–142.
J. Haisma, et al., "Resistance Modification of Indium Oxide Layers by Laser Annealing and Ion Bombardment Respectively", *Philips Journal of Research* vol. 41, p. 77 (1986).
T. Serikawa, et al., "Studies of H$_{2+}$ Implantation Into Indium–Tin–Oxide Films", *Nuclear Instrumentation Methods B* vol. 37/38, p. 732 (1989).
Y. Shigesato, et al., "Study of the Effect of Ion Implantation on the Electrical and Microstructural Properties of Tin-–Doped Indium Oxide Thin Films", *Journal of Applied Physics* vol. 73, p. 3805 (1993).
Y. Shigesato, et al., "Laser and Ion Beam Modification of Materials", *Proceedings of the 1993 International Conference on Advanced Materials*, I, Yamada, et al., ed. (1994).
T. E. Haynes, et al., "Donor generation from native defects induced by In+ implantation into tin–doped indium oxide", *Journal of Applied Physics* vol. 77, p. 2572 (1994).
S. Pongratz, "Info highway will be viewed on flat panel displays," *R&D Magazine*, p. 27, Apr. 1994.

*Primary Examiner*—Archene Turner
*Attorney, Agent, or Firm*—Joseph A. Marasco; Harold W. Adams

[57] ABSTRACT

An electrical device includes a substrate having an ITO coating thereon, a portion of which is conductive and defines at least one electrical pathway, and the balance of the ITO being insulative. The device is made by the following general steps:

a. providing a substrate having a conductive ITO coating on at least one surface thereof;
  b. rendering a preselected portion of the coating of conductive ITO insulative, leaving the remaining portion of conductive ITO as at least one electrical pathway.

3 Claims, 4 Drawing Sheets

METHOD OF FORMING ELECTRICAL PATHWAYS IN INDIUM-TIN-OXIDE COATINGS

The United States Government has rights in this invention pursuant to contract no. DE-AC05-84OR21400 between the United States Department of Energy and Lockheed Martin Energy Systems, Inc. The invention was funded by the Division of Materials Sciences, office of Basic Energy Sciences.

FIELD OF THE INVENTION

The present invention relates to indium-tin-oxide coatings used in electrical devices, and more particularly to the forming of forming insulative (highly-resistive) patterns in conductive indium-tin-oxide coatings via ion implantation in order to define an electrical pathway.

BACKGROUND OF THE INVENTION

Indium-tin-oxide (ITO), also known as tin-doped indium oxide, is a transparent conducting solid often used as a thin-film coating in applications where radiant energy, especially light, is coupled into a substrate that is provided with electrical contacts. For instance, devices such as flat-panel displays and smart windows rely on ITO coatings to carry electrical signals across the surface of a glass substrate while allowing light to pass through. In some applications, such as flat-panel displays, it is necessary to make patterns in conducting ITO coatings in order to fabricate separate conducting signal lines from the initial continuous ITO layers.

Insulating patterns are generally formed by photolithography combined with either wet chemical etching or plasma etching, which removes the ITO coating from selected regions. This has disadvantages, one of which is the resultant raised pattern of conducting ITO, which is less suitable for deposition of subsequent coatings and more susceptible to physical damage than is a smooth, contiguous area. Therefore, it is desirable to form insulating patterns that have the same thickness and are contiguous with the conducting ITO patterns.

Moreover, these conventional methods tend to generate relatively large quantities of corrosive, environmentally unsafe, and/or otherwise hazardous by-products. Therefore, it is desirable to form insulating patterns via methods that generate relatively safe, non-hazardous by-products.

For further information, refer to the following publications:

1. J. Haisma, et al., "Resistance Modification of Indium Oxide Layers by Laser Annealing and Ion Bombardment Respectively", *Philips Journal of Research* vol. 41, p. 77 (1986).

2. T. Serikawa, et al., "Studies of $H_2^+$ Implantation Into Indium-Tin-Oxide Films", *Nuclear Instrumentation Methods B* vol. 37/38, p. 732 (1989).

3. Y. Shigesato, et al., "Study of the Effect of Ion Implantation on the Electrical and Microstructural Properties of Tin-Doped Indium Oxide Thin Films", *Journal of Applied Physics* vol. 73, p. 3805 (1993).

4. Y. Shigesato, et al., "Laser and Ion Beam Modification of Materials", *Proceedings of the 1993 International Conference on Advanced Materials*, I, Yamada, et al., ed. (1994).

5. T. E. Haynes, et al., "Donor generation from native defects induced by In+ implantation into tin-doped indium oxide", *Journal of Applied Physics* vol. 77, p. 2572 (1994).

6. S. Pongratz, "Info highway will be viewed on flat panel displays," *R&D Magazine*, p. 27, Apr. 1994.

OBJECTS OF THE INVENTION

Accordingly, it is an object of the present invention to provide a new and improved method of forming insulative patterns in conducting ITO coatings, thereby defining electrically conductive regions.

It is another object of the present invention to provide conductive patterns in ITO coatings that are electrically separated without the requirement for actual removal of ITO material.

It is a further object of the present invention to provide a new and improved method of forming electrical pathways in ITO coatings so that the surfaces thereof are smooth and contiguous.

It is another object of the present invention to provide a new and improved method of forming insulative patterns in conducting ITO coatings via methods that generate relatively safe, non-hazardous by-products.

It is yet a further object of the present invention to provide a new and improved method of forming electrical pathways in ITO coatings so that the surfaces thereof are suitable for subsequent overcoating.

Further and other objects of the present invention will become apparent from the description contained herein.

SUMMARY OF THE INVENTION

In accordance with one aspect of the present invention, the foregoing and other objects are achieved by an electrical device which includes a substrate having an ITO coating thereon, a portion of which is conductive and defining at least one electrical pathway, and the balance of the ITO being insulative.

In accordance with one aspect of the present invention, a method of fabricating an electrical pathway in ITO includes the following general steps:

a. providing a substrate having a conductive ITO coating on at least one surface thereof;

b. rendering a preselected portion of the coating of conductive ITO insulative, leaving the remaining portion of conductive ITO as at least one electrical pathway.

BRIEF DESCRIPTION OF THE DRAWING

In the drawing.

For clarity and simplicity, like elements in the figures are identified with like numerals.

Figure 1:
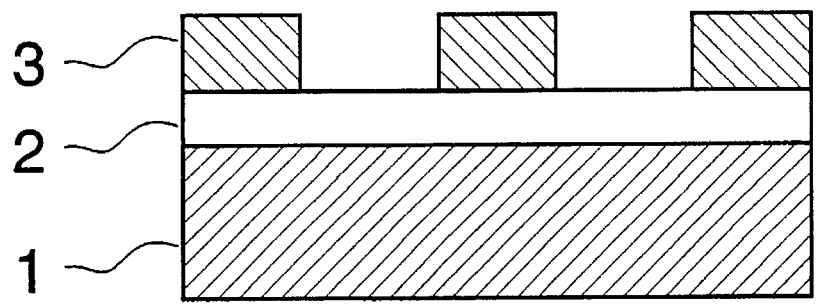
FIG. 1 is a schematic sectional view of a substrate having thereon coatings of conductive ITO and photomask.

For a better understanding of the present invention, together with other and further objects, advantages and capabilities thereof, reference is made to the following disclosure and appended claims in connection with the above-described drawings.

DETAILED DESCRIPTION OF THE INVENTION

There are two known sources of carriers of electricity in ITO—tin dopants ($Sn^{\cdot}$), and oxygen vacancies ($V_o^{\cdot\cdot}$). The respective concentrations of these donors in typical low-resistance films are $[Sn^{\cdot}]=3\times10^{20}/cm^3$ and $[V_o^{\cdot\cdot}]=3\times10^{20}/cm^3$, although much variation can be expected in commercially available materials.

As used herein, the term "conductive" defines that property wherein sufficient electricity is conducted through a given material to be useful for an intended purpose. Moreover, the term "insulative", as used herein, defines that property wherein sufficient electrical insulation is provided by a given material to be useful for an intended purpose.

To render ITO films insulative, both sources of carriers of electricity should be eliminated. Sn donors are deactivated by induced crystal disorder, especially the type of damage induced by ion implantation. Implanted ions, especially $O^+$, occupy oxygen vacancies during implantation, thereby removing these donors. Thus, the present invention comprises a method of deactivating Sn dopants and deactivating oxygen vacancies by a single method.

The method described herein for making a coating of ITO highly resistive relates to implantation of ions, preferably $O^+$ ions, into the surface thereof to eliminate the sources of the carrier of electricity. The minimum dose of $O^+$ that will be required is generally equal to the number of oxygen vacancies in the thin film and is generally proportional to the coating thickness. Larger doses may likely be required if the efficiency of vacancy occupation is less than 100%. The $O^+$ ions are preferably implanted at an energy such that the average penetration depth is about the center of the film thickness. For example, beam energy is typically about 80 keV for a coating having a thickness of about 200 nm. Multiple energies may be employed in a sequence in order to distribute the ions more evenly throughout the thickness of the film.

Although oxygen ions are preferred, similar results are achieved using other species such as fluorine. The efficiency is less, as expected, on the basis of the different oxidation states of the two elements O and F. This demonstration suggests a generalization of the invention to other ion species with a high level of confidence. It is believed that ions of other species such as S, P, C, and other halogens are also useful for carrying out the invention. Some of these species produce less hazardous by-products than others.

The required energies and doses can be easily achieved by conventional ion implantation methods using commercially available ion implanters, or, alternatively, by introducing oxygen using commercially available plasma generators.

Diffusion of oxygen from a non-ionized source may be used to provide occupation of oxygen vacancies, followed by low ion dose to induce crystal disorder. Generally, any energetic ion species is considered suitable for this particular embodiment of the invention. The two method steps may be carried out simultaneously or in reverse order.

The substrate can be heated or cooled to optimize the efficiency of the above method.

Figure 2:
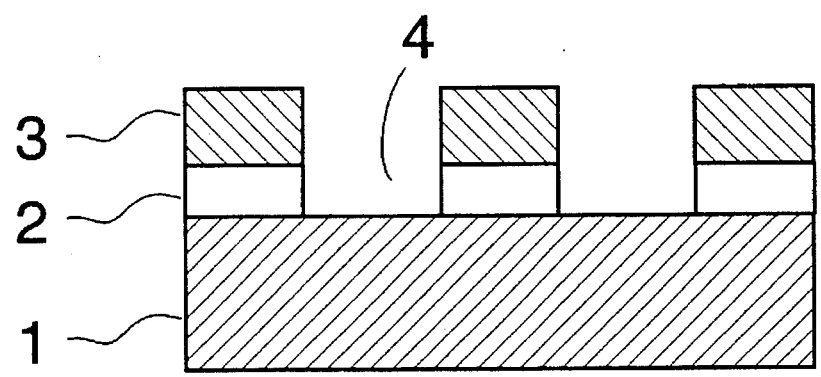
FIG. 2 is a schematic sectional view of a substrate as in FIG. 1, the non-masked portion of the conductive ITO coating having been removed, as is known in the prior art.
Figure 3:
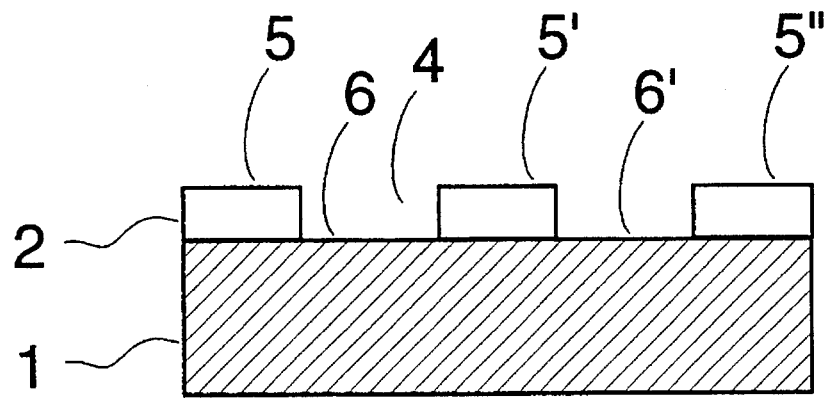
FIG. 3 is a schematic sectional view of a substrate as in FIG. 2, the photomask coating having been removed, resulting in an article having a pattern of conductive ITO on the substrate, as is known in the prior art.
Figure 6:
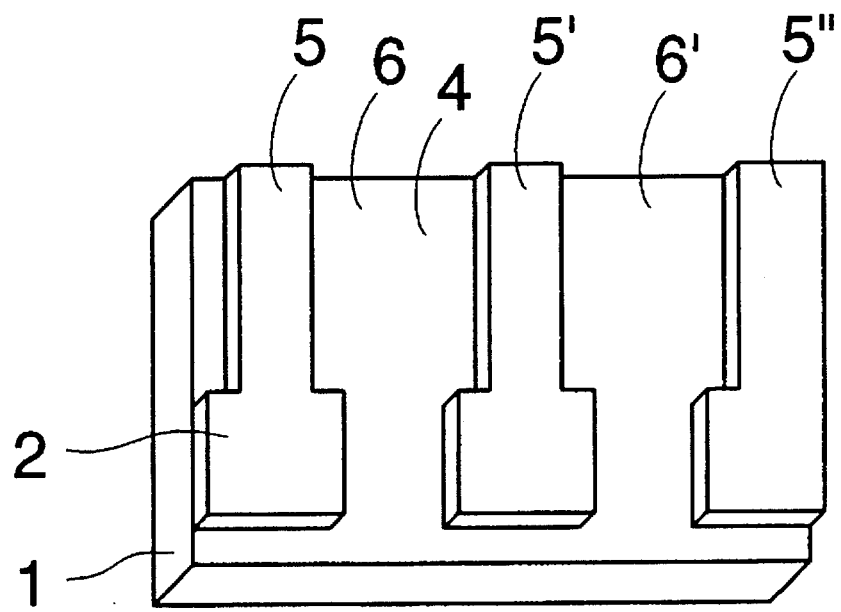
FIG. 6 is an oblique view of the article shown in FIG. 3.

The drawings show the significance of the invention. FIG. 1 shows a substrate 1 having thereon coatings of conductive ITO 2 and photomask 3. FIG. 2 shows the substrate 1 as in FIG. 1, the non-masked portion of the conductive ITO coating 2 having been removed, leaving a void 4, as is known in the prior art, to produce the article shown in FIGS. 3 and 6. The photomask coating has been removed, leaving a raised pattern 5, 5', 5" of conductive ITO 2 (sometimes referred to as ridges), the void 4 leaving exposed, depressed areas of substrate 6, 6' (sometimes referred to as troughs). The surface having raised portions 5, 5' , 5" and depressed portions 6, 6', it is neither smooth nor contiguous; rather the surface thereof is characterized as ridged and troughed.

Figure 4:
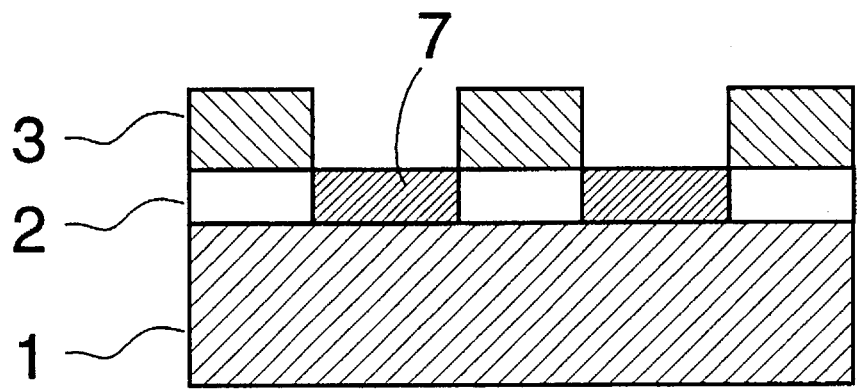
FIG. 4 is a schematic sectional view of a substrate as in FIG. 1, the non-masked portion of the conductive ITO coating having been implanted with ions according to the present invention.
Figure 5:
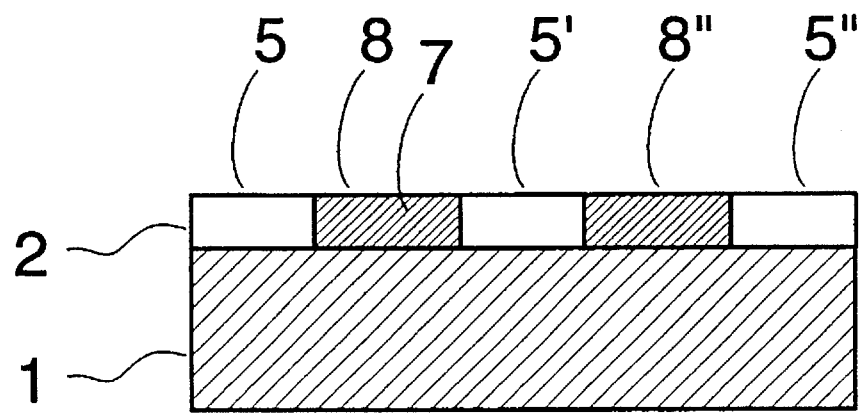
FIG. 5 is a schematic sectional view of a substrate as in FIG. 4, the photomask coating having been removed, resulting in an article having a contiguous layer of ITO having a pattern of conductive ITO and non-conductive ITO on the substrate, in accordance with the present invention.
Figure 7:
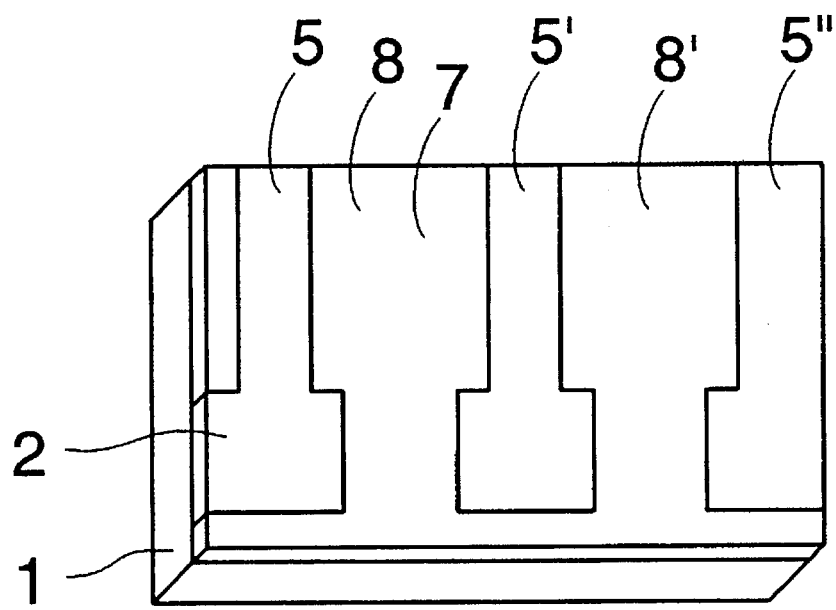
FIG. 7 is an oblique view of the article shown in FIG. 5.

According to the present invention, FIG. 4 shows a substrate 1 as in FIG. 1, the non-masked portion of the conductive ITO coating having been implanted with ions, leaving a non-conductive region of ITO 7, to produce an article as shown in FIGS. 5 and 7. The photomask coating has been removed, leaving a pattern 5, 5', 5", and 8, 8' of ITO 2, and non-conductive ITO 7, respectively, in accordance with the present invention. The surface thereof is characterized as smooth and contiguous.

EXAMPLE I

An series of tests of present invention were conducted under the following conditions:

| | |
|---|---|
| Substrate: | Glass |
| Coating: | ITO |
| Coating thickness: | 200 nm |
| Implanted ion species: | Oxygen, Fluorine, Nitrogen |
| Ion implantation energy: | 80 keV |
| Substrate temperature: | −196° C., 20° C. |
| Ion dose range: | $10^{13}/cm^2$ $10^{17}/cm^2$ |

Figure 8:
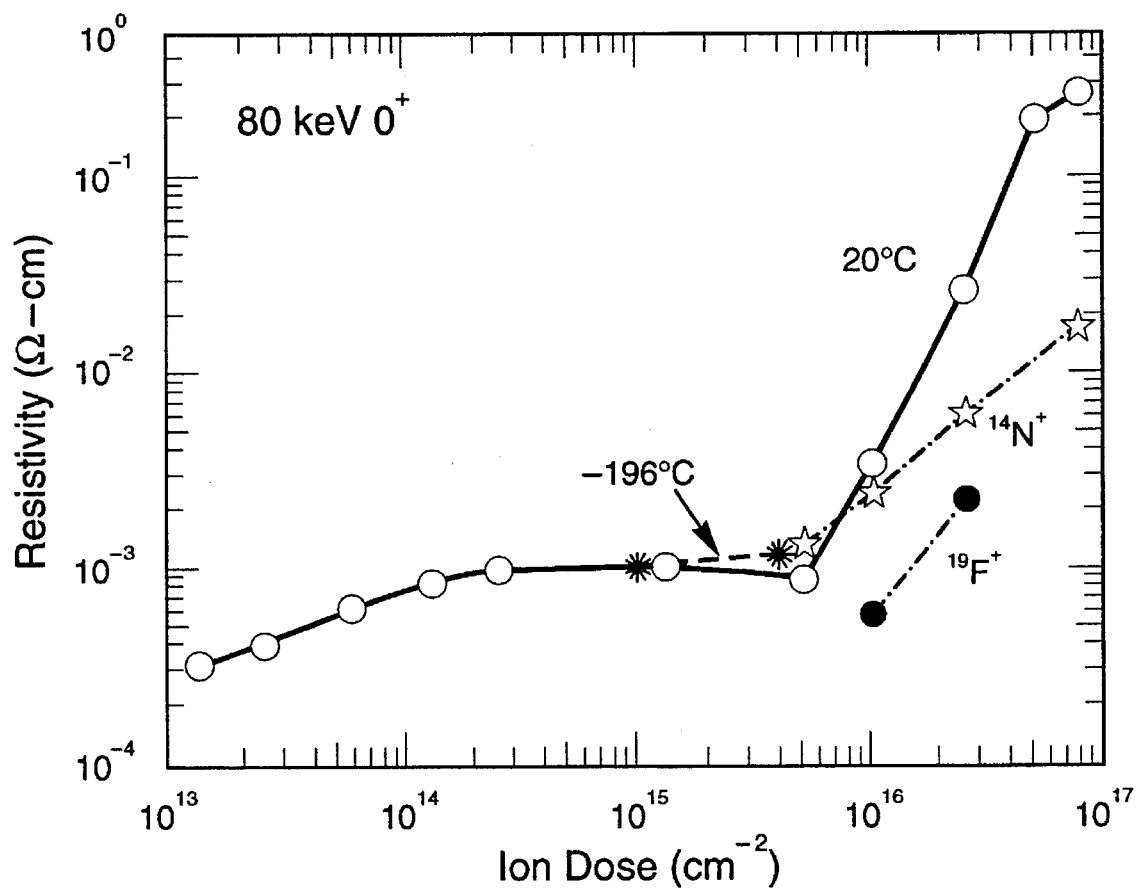
FIG. 8 shows experimental results for resistivity of a 200-nm-thick ITO coating after implantation of $O^+$ at various doses.

The implanted region was analyzed; results thereof are recorded in FIG. 8.

FIG. 8 shows experimental results for resistivity of a 200 nm thick ITO coating after implantation of $O^+$ and $F^+$ at various doses. The data shows that the resistivity has been increased by more than a factor of 1000 using a dose of about $8\times10^{16}/cm^2$ of $O^+$. From these data, the efficiency of the implanted oxygen to deactivate oxygen vacancies has been estimated to be about 25%. The potential exists to increase the resistivity even further by increasing the ion dose. A further increase of 1 to 2 orders of magnitude may be suitable for some applications. The resistivity requirement for a particular application may easily be ascertained by a survey of the specific needs thereof.

The photomasking steps may be avoided by using a direct writing ion implantation method.

Advantages of the present invention include:
(1) preservation of an intact, contiguous, and smooth surface rather than an etched, uneven surface;
(2) About 100x fewer ions needed for the present invention than for dry or plasma etching (faster, more efficient processing);
(3) environmentally safer, less or non hazardous by-products, especially when oxygen is used as feed gas;
(4) reduced number of mask steps via direct writing (increased process efficiency);
(5) capability for large-area processing (e.g., by using sheet beam ion sources similar to those used for sputter deposition);
(6) Room temperature processing for compatability with heat sensitive substrates.

The invention is particularly useful for defining and fabricating the non-conducting portion of patterned, conducting ITO thin-film coatings used in the manufacture of diverse products, such as flat-panel displays, active-matrix liquid-crystal displays, electroluminescent displays, "smart" windows, cells, and any other applications where it is required to pass visible light through a coating containing electrically conducting elements separated by nonconducting barriers.

While there has been shown and described what are at present considered the preferred embodiments of the invention, it will be obvious to those skilled in the art that various changes and modifications can be made therein without departing from the scope of the inventions defined by the appended claims.

What is claimed is:

1. An electrical device comprising a substrate having an ITO coating on at least one surface thereof, a portion of said ITO coating being conductive, and the balance of said ITO being insulative.

2. An article in accordance with claim 1 wherein said conductive portion of said ITO coating defines at least one electrical pathway.

3. An article in accordance with claim 1 wherein said ITO coating is smooth and contiguous.

* * * * *